United States Patent
Reddy et al.

(10) Patent No.: US 10,049,869 B2
(45) Date of Patent: Aug. 14, 2018

(54) COMPOSITE DIELECTRIC INTERFACE LAYERS FOR INTERCONNECT STRUCTURES

(71) Applicant: Lam Research Corporation, Fremont, CA (US)

(72) Inventors: Kapu Sirish Reddy, Portland, OR (US); Nagraj Shankar, Tualatin, OR (US); Shankar Swaminathan, Beaverton, OR (US); Meliha Gozde Rainville, Beaverton, OR (US); Frank L. Pasquale, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/282,543

(22) Filed: Sep. 30, 2016

(65) Prior Publication Data

US 2018/0096886 A1 Apr. 5, 2018

(51) Int. Cl.
*H01L 21/02* (2006.01)
*H01L 21/768* (2006.01)
(Continued)

(52) U.S. Cl.
CPC .... *H01L 21/02145* (2013.01); *H01L 21/0228* (2013.01); *H01L 21/02178* (2013.01);
(Continued)

(58) Field of Classification Search
CPC .. H01L 21/76829; H01L 21/76832–21/76835; H01L 21/02145;
(Continued)

(56) References Cited

U.S. PATENT DOCUMENTS 6,001,420 A * 12/1999 Mosely ............ H01L 21/76843
257/E21.585
6,416,822 B1 7/2002 Chiang et al.
(Continued)

FOREIGN PATENT DOCUMENTS

KR 10-2014-0129618 A 11/2014

OTHER PUBLICATIONS

U.S. Office Action, dated Jun. 29, 2016, issued in U.S. Appl. No. 14/949,533.
(Continued)

*Primary Examiner* — Marvin Payen
*Assistant Examiner* — Jeremy Joy
(74) *Attorney, Agent, or Firm* — Weaver Austin Villeneuve & Sampson LLP

(57) ABSTRACT

Dielectric composite films characterized by a dielectric constant (k) of less than about 7 and having a density of at least about 2.5 g/cm³ are deposited on partially fabricated semiconductor devices to serve as etch stop layers. The composite films in one embodiment include at least two elements selected from the group consisting of Al, Si, and Ge, and at least one element selected from the group consisting of O, N, and C. In one embodiment the composite film includes Al, Si and O. In one implementation, a substrate containing an exposed dielectric layer (e.g., a ULK dielectric) and an exposed metal layer is contacted with an aluminum-containing compound (such as trimethylaluminum) and, sequentially, with a silicon-containing compound. Adsorbed compounds are then treated with an oxygen-containing plasma (e.g., plasma formed in a $CO_2$-containing gas) to form a film that contains Al, Si, and O.

11 Claims, 6 Drawing Sheets

(51) Int. Cl.
*H01L 23/528* (2006.01)
*H01L 23/532* (2006.01)
*C23C 16/40* (2006.01)
*C23C 16/455* (2006.01)

(52) U.S. Cl.
CPC .. *H01L 21/02271* (2013.01); *H01L 21/76832* (2013.01); *H01L 23/5283* (2013.01); *H01L 23/53295* (2013.01); *C23C 16/401* (2013.01); *C23C 16/403* (2013.01); *C23C 16/45525* (2013.01); *H01L 21/0217* (2013.01); *H01L 21/02164* (2013.01); *H01L 21/02167* (2013.01)

(58) Field of Classification Search
CPC ........... H01L 21/0228; H01L 21/02178; H01L 21/3141; C23C 16/401; C23C 16/403; C23C 16/45525
See application file for complete search history.

(56) References Cited

U.S. PATENT DOCUMENTS

| | | | |
|---|---|---|---|
| 6,428,859 B1 | 8/2002 | Chiang et al. | |
| 6,576,053 B1* | 6/2003 | Kim | C30B 25/02 117/89 |
| 6,867,152 B1* | 3/2005 | Hausmann | C23C 16/401 257/E21.278 |
| 7,202,185 B1* | 4/2007 | Hausmann | C23C 16/0272 257/E21.279 |
| 7,273,822 B2* | 9/2007 | Yeo | H01L 21/28562 257/E21.171 |
| 7,576,006 B1 | 8/2009 | Yu et al. | |
| 7,648,899 B1 | 1/2010 | Banerji et al. | |
| 7,776,763 B2 | 8/2010 | Reid et al. | |
| 7,790,633 B1* | 9/2010 | Tarafdar | H01L 21/02164 257/E21.471 |
| 7,858,510 B1 | 12/2010 | Banerji et al. | |
| 8,747,964 B2 | 6/2014 | Park et al. | |
| 9,190,489 B1 | 11/2015 | Mountsier | |
| 9,245,792 B2 | 1/2016 | Chen et al. | |
| 9,633,896 B1 | 4/2017 | Damjanovic et al. | |
| 9,859,153 B1 | 1/2018 | Rainville et al. | |
| 2002/0155695 A1* | 10/2002 | Lee | H01L 21/76801 438/622 |
| 2003/0209738 A1* | 11/2003 | Ohto | H01L 21/32136 257/257 |
| 2004/0043149 A1* | 3/2004 | Gordon | C07F 9/091 427/255.31 |
| 2004/0063308 A1* | 4/2004 | Bao | H01L 21/02126 438/637 |
| 2004/0198069 A1* | 10/2004 | Metzner | C23C 16/308 438/785 |
| 2005/0001318 A1 | 1/2005 | Won | |
| 2005/0003662 A1 | 1/2005 | Jursich et al. | |
| 2005/0199945 A1* | 9/2005 | Kodama | H01L 27/115 257/324 |
| 2005/0239243 A1 | 10/2005 | Tran et al. | |
| 2005/0271813 A1* | 12/2005 | Kher | C23C 16/0272 427/248.1 |
| 2007/0049043 A1* | 3/2007 | Muthukrishnan | H01L 21/28202 438/758 |
| 2008/0079111 A1* | 4/2008 | Clark | C23C 16/308 257/506 |
| 2008/0081113 A1* | 4/2008 | Clark | C23C 16/308 427/255.394 |
| 2008/0138969 A1* | 6/2008 | Kaneko | H01L 21/28097 438/591 |
| 2009/0039416 A1* | 2/2009 | Lai | H01L 21/28282 257/325 |
| 2010/0062149 A1* | 3/2010 | Ma | C23C 16/45534 427/126.1 |
| 2010/0113265 A1* | 5/2010 | Suzuki | B01D 53/02 502/408 |
| 2011/0065276 A1* | 3/2011 | Ganguly | H01L 21/0223 438/694 |
| 2012/0202301 A1* | 8/2012 | Yaegashi | G03F 7/0035 438/8 |
| 2012/0241958 A1 | 9/2012 | Streck et al. | |
| 2013/0153963 A1* | 6/2013 | Shealy | H01L 23/291 257/190 |
| 2013/0171810 A1* | 7/2013 | Sun | H01L 29/6659 438/514 |
| 2013/0330936 A1* | 12/2013 | Lachaud | C23C 16/402 438/787 |
| 2014/0017414 A1* | 1/2014 | Fukazawa | C23C 16/403 427/576 |
| 2015/0179706 A1* | 6/2015 | Rocklein | H01L 27/2481 257/4 |
| 2016/0017487 A1* | 1/2016 | Chen | C23C 16/34 427/569 |
| 2016/0071735 A1* | 3/2016 | Yen | H01L 21/32139 438/478 |
| 2016/0133572 A1* | 5/2016 | Zhang | H01L 21/0337 257/762 |
| 2016/0307766 A1* | 10/2016 | Jongbloed | H01L 21/3081 |
| 2017/0103914 A1 | 4/2017 | Damjanovic et al. | |
| 2017/0309514 A1 | 10/2017 | Rainville et al. | |

OTHER PUBLICATIONS

U.S. Notice of Allowance, dated Dec. 21, 2016, issued in Application No. 14/949,533.
Frietas, Jr., J.A. et al., (2012) "Structural and optical properties of thick freestanding AlN films prepared by hydride vapor phase epitaxy," *Journal of Crystal Growth*, 350:33-37 [Available online Dec. 30, 2011].
Jeon et al. (2002) "Atomic Layer Deposition of $Al_2O_3$ Thin Films Using Trimethylaluminum and Isopropyl Alcohol," *Journal of the Electrochemical Society*, 149(6): C306-C310.
Ritala et al. (Apr. 14, 2000) "Atomic Layer Deposition of Oxide Thin Films with Metal Alkoxides as Oxygen Sources," *Science*, 288:319-321.
U.S. Notice of Allowance, dated May 23, 2017, issued in U.S. Appl. No. 15/350,911.
U.S. Appl. No. 15/195,539, filed Jun. 28, 2016, Rainville et al.
U.S. Appl. No. 15/350,911, filed Nov. 14, 2016, Rainville et al.
U.S. Notice of Allowance, dated Aug. 25, 2017, issued in U.S. Appl. No. 15/350,911.
PCT International Search Report and Written Opinion (ISA/KR) dated Jan. 8, 2018 issued in PCT/US2017/053764.
U.S. Appl. No. 15/821,097, filed Nov. 22, 2017, Rainville et al.

* cited by examiner

COMPOSITE DIELECTRIC INTERFACE LAYERS FOR INTERCONNECT STRUCTURES

FIELD OF THE INVENTION

This invention pertains to methods of semiconductor substrate processing. Specifically, this invention pertains to methods of depositing dielectric etch stop layers over interlayer dielectric (ILD) and metal during integrated circuit (IC) fabrication.

BACKGROUND

In integrated circuit fabrication, metal lines (such as copper lines) are typically embedded in ILD layers, where the ILD is often a porous silicon oxide based dielectric material or an organic polymeric dielectric material having a low dielectric constant, such as an ultra-low-k (ULK) dielectric with a dielectric constant of 2.2 or less. Formation of such embedded metal lines using a Damascene process requires patterning and etching of the ILD to form vias and trenches, followed by filling of these vias and trenches with a metal (e.g., copper), for example, using electroplating. After the vias and trenches are filled with a metal, a second layer of ILD is deposited and is again patterned to form vias and trenches. These recessed features are again filled with a metal, such that a stack of ILD layers having embedded metal lines is formed, where the metal lines form the conductive paths of an integrated circuit. Etch stop layers are often deposited over individual ILD layers and metal lines, and are used in patterning operations of the IC fabrication process to protect the material residing underneath these layers from being etched during patterning. For example, the semiconductor substrate may include an etch stop layer residing between two ILD layers. When the top ILD layer is patterned and etched (e.g., with a fluorine-based chemistry) to define vias and trenches, the etch stop layer protects the bottom ILD layer underneath the etch stop from being etched.

The material of the etch stop layer should exhibit good etch selectivity versus the material that is being etched. In other words, the etch stop layer material should be etched at a significantly lower rate than the exposed ILD material (or other material that is being patterned).

Etch stop layers typically are not completely removed during the integrated circuit fabrication, and remain in the final manufactured semiconductor device as thin films between thicker ILD layers. Examples of conventionally used etch stop layer materials include silicon carbide and silicon nitride.

SUMMARY

Methods, apparatus, and systems for forming composite dielectric materials are provided. Provided materials are highly suitable for use as etch stop layers, since they are characterized by low dielectric constants (k) and have relatively high densities. Low dielectric constants are highly desirable for etch stop layers because etch stop layers are not completely removed from the semiconductor device during processing, and the final device usually contains thin etch stop layers between the individual ILD layers. In order to minimize cross-talk between metal lines and to reduce the resistance-capacitance (RC) delay, it is important to use etch stop materials with low dielectric constants. However, many conventional low-k materials often have relatively low etch selectivity versus the ILD material. Therefore, materials with low dielectric constants and high etch selectivity are needed. Etch selectivity is a property that positively correlates with material density. Therefore, materials that concurrently possess low dielectric constant and high density are desired.

The composite dielectric materials provided herein, according to some embodiments, are characterized by dielectric constants of less than about 7, such as of between about 5-6.5, and densities of at least about 2.5 g/cm$^3$, such as between about 2.5-3.5 g/cm$^3$ (e.g., between about 2.6-3.2 g/cm$^3$). Furthermore, composite dielectric films containing Al, Si, and O, with dielectric constants of less than about 6, and densities of greater than about 2.5 g/cm$^3$ are provided. In some implementations composite dielectric films with dielectric constants of about 5-5.5, and densities of about 2.5-2.8 g/cm$^3$, are formed.

According to one aspect, a method for processing a semiconductor substrate is provided. The method includes: (a) providing a semiconductor substrate comprising an exposed metal layer and an exposed dielectric layer; and (b) forming a dielectric composite film over the metal layer and the dielectric layer, wherein the dielectric composite film comprises at least two elements selected from the group consisting of Al, Si, and Ge, and at least one element selected from the group consisting of O, N, and C, wherein the dielectric composite film has a dielectric constant of less than about 7, and a density of at least about 2.5 g/cm$^3$. In some embodiments the dielectric composite film is an etch stop film.

In one embodiment the dielectric composite film comprises Al, Si, and O. Such films can be formed by (i) providing an aluminum-containing precursor and a silicon-containing precursor to a process chamber housing the semiconductor substrate; and (iii) reacting the aluminum-containing precursor and the silicon-containing precursor with an oxygen-containing species to form the dielectric composite film on the semiconductor substrate, wherein the formed film comprises Al—O and Si—O bonds. In some embodiments the aluminum-containing precursor and the silicon-containing precursor are provided to the process chamber sequentially, and the composite dielectric film is formed by atomic layer deposition (ALD). In other embodiments, the aluminum-containing precursor and the silicon-containing precursor are allowed to mix within the process chamber and the dielectric composite film is deposited by chemical vapor deposition (CVD). In some embodiments the dielectric composite film is deposited by a combination of ALD and CVD. Both ALD and CVD may be thermal (conducted in an absence of plasma), or plasma-assisted.

In one implementation the dielectric composite film comprises a plurality of alternating sublayers, wherein the plurality of alternating sublayers comprise sublayers of a first type comprising Al and O, and sublayers of a second type comprising Si and O. This embodiment is referred to as a nanolaminate embodiment.

In one implementation the dielectric composite film is formed using a method that comprises: (i) providing an aluminum-containing precursor (e.g., trimethylaluminum) to a process chamber housing the semiconductor substrate and adsorbing the aluminum-containing precursor on the surface of the semiconductor substrate; (ii) after the aluminum-containing precursor has adsorbed, purging and/or evacuating the process chamber; (iii) after purging, providing a silicon-containing precursor (e.g., diisopropylaminosilane) into the process chamber and adsorbing the silicon-containing precursor on the surface of the semiconductor substrate; (iv) after the silicon-containing precursor has adsorbed, purging and/or evacuating the process chamber; and (v) after purging, reacting the adsorbed aluminum-containing precursor and the silicon-containing precursor with an oxygen-containing species (e.g., with a plasma formed in an oxygen-containing gas) to form the dielectric composite film comprising Al—O and Si—O bonds on the semiconductor substrate. In one implementation, the treatment with an oxygen-containing species includes forming a plasma in a process gas comprising $CO_2$. The methods typically include repeating operations (i)-(v). In some implementations steps (i)-(v) are performed three times or more until the composite dielectric film is formed to a desired thickness.

In some embodiments the dielectric composite film is formed to a thickness of between about 10-50 Å, such as to a thickness of between about 20-30 Å.

Provided films can be deposited on a variety of substrates. In some embodiments the dielectric composite film is deposited over the semiconductor substrate having an exposed layer of ULK dielectric and an exposed layer of metal selected from the group consisting of copper, tungsten, and cobalt.

Provided methods can be integrated with the photolithographic techniques used for patterning of layers on a semiconductor substrate. In some embodiments provided methods further include: applying photoresist to the semiconductor substrate; exposing the photoresist to light; patterning the photoresist and transferring the pattern to the semiconductor substrate; and selectively removing the photoresist from the semiconductor substrate.

According to another aspect, an apparatus configured for depositing dielectric composite films is provided. In one embodiment the apparatus includes a process chamber having a support for holding the semiconductor substrate and a controller. The controller includes program instructions for conducting any of the deposition methods provided herein. In some embodiments, the controller is programmed for: forming a dielectric composite film over the metal layer and the dielectric layer, wherein the dielectric composite film comprises at least two elements selected from the group consisting of Al, Si, and Ge, and at least one element selected from the group consisting of O, N, and C, wherein the dielectric composite film has a dielectric constant of less than about 7, and a density of at least about 2.5 g/cm³. The program instructions may include instructions for: (a) introducing (e.g., sequentially introducing) an aluminum-containing precursor and a silicon containing-precursor to the process chamber; and (b) reacting (e.g., sequentially reacting) the aluminum-containing precursor and the silicon-containing precursor with an oxygen-containing species to form a dielectric composite film on a substrate, wherein the film comprises Al—O and Si—O bonds.

In some embodiments the apparatus comprises a first conduit configured for delivery of an aluminum-containing precursor to the process chamber; and a second conduit configured for delivery of a silicon-containing precursor to the process chamber, wherein the first and second conduits are different conduits.

According to another aspect, a system is provided herein which includes the deposition apparatus for depositing a dielectric composite film and a stepper.

According to another aspect, a non-transitory computer machine-readable medium is provided. It includes program instructions for control of a deposition apparatus. The instructions include code for deposition methods provided herein. In some embodiments code is provided for: (a) introducing (e.g., sequentially introducing) an aluminum-containing precursor and a silicon containing-precursor to the process chamber; and (b) reacting (e.g., sequentially reacting) the aluminum-containing precursor and the silicon-containing precursor with an oxygen-containing species to form a dielectric composite film on a substrate, wherein the film comprises Al—O and Si—O bonds.

According to another aspect a semiconductor device comprising a dielectric composite film is provided, wherein the dielectric composite film comprises at least two elements selected from the group consisting of Al, Si, and Ge, and at least one element selected from the group consisting O, C, and N, wherein the composite dielectric film has a thickness of between about 10-50 Å, and is characterized by a dielectric constant of less than about 7, and a density of at least about 2.5 g/cm³.

These and other features and advantages of the present invention will be described in more detail below with reference to the associated drawings.

DETAILED DESCRIPTION

Figure 1A:
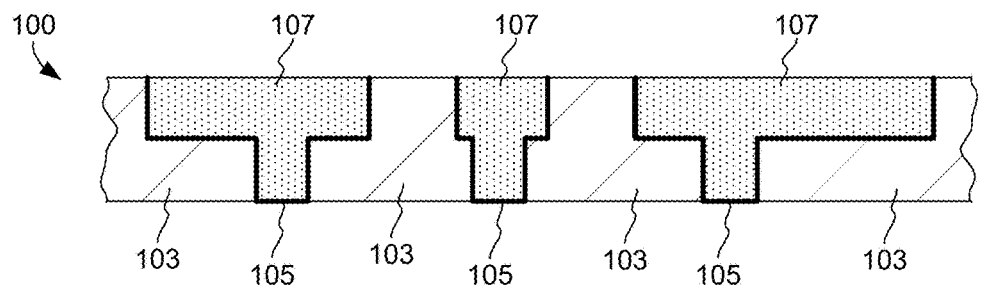
FIGS. 1A-1C show cross-sectional views of a semiconductor substrate during processing illustrating etch stop films according to an embodiment provided herein.

In the following detailed description, numerous specific implementations are set forth in order to provide a thorough understanding of the disclosed implementations. However, as will be apparent to those of ordinary skill in the art, the disclosed implementations may be practiced without these specific details or by using alternate elements or processes. In other instances well-known processes, procedures, and components have not been described in detail so as not to unnecessarily obscure aspects of the disclosed implementations.

In this description, the terms "semiconductor wafer," "semiconductor substrate", "wafer," "substrate," "wafer substrate" and "partially fabricated integrated circuit" are used interchangeably. One of ordinary skill in the art would understand that the term "partially fabricated integrated circuit" can refer to a silicon wafer during any of many stages of integrated circuit fabrication thereon. The following detailed description describes deposition of interfacial layers on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like. The term "semiconductor wafer" or "semiconductor substrate" used herein refers to a substrate that has semiconductor material anywhere within its body, and it is understood that the semiconductor material does not need to be exposed. In many embodiments the semiconductor substrate includes one or more dielectric and conductive layers formed over the semiconductor material.

The composite films provided herein contain at least two elements of a first type (e.g., at least two elements selected from the group consisting of Al, Si, and Ge) and at least one element of a second type (e.g., at least one element selected from the group consisting of O, C, and N). An element of a first type usually has a smaller electronegativity than an element of the second type. The term "composite" as used herein refers to the presence of at least two different elements of the first type. For example, the composite film may contain Al and Si (elements of the first type) and O and C (elements of the second type). In addition to the elements of the first and second type, composite films may contain hydrogen. In some embodiments provided composite films comprise (or consist essentially of) Al, Si, and O, and further optionally may include H, C, and N. In some embodiments, the films contain at least 5 atomic % Al, at least 5 atomic % Si, and at least 5 atomic % O (where hydrogen, if present, is not included in the calculation). In some embodiments, the films contain about 5-60 atomic %, such as about 5-40 atomic % of Al, and about 5-60 atomic %, such as about 5-40 atomic % of Si, (where hydrogen, if present, is not included in the calculation of atomic percent content).

The different elements of the first type may be intermixed within the composite film, or may be present in distinct sublayers. For example, in one embodiment the composite film is an AlSiOC film, in which the elements are substantially uniformly mixed. In another embodiment, the composite film includes a plurality of alternating sublayers, wherein a first sublayer includes a first element of the first type (e.g., Al), and the second sublayer includes a second element of the first type (e.g., Si). An example of a film having multiple sublayers is a film having at least two sublayers of a first type that include Al, and O, and at least two sublayers of a second type that include Si and O, wherein the sublayers of the first and second type alternate in the stack. It is noted that individual sublayers are preferably very thin (such as 10 Å thick or less, e.g., about 5 Å thick), and the entire composite film is preferably less than about 100 Å thick, such as less than about 50 Å thick with a typical thickness of between about 20-30 Å. Provided films are distinct from combinations of metal-containing capping layers and dielectric diffusion barrier films, because different elements of the first type (e.g., Si and Al) are either intermixed in the composite film, or present in very thin alternating sublayers.

Composite films provided herein address an important need for materials that have the following properties: low dielectric constant, high density, low leakage current, good adhesion properties, and metal oxidation resistance. In some embodiments composite films provided herein have all of the desirable characteristics listed above. The need for such materials stems from the fact that many binary compounds, such as aluminum oxide or silicon oxide, possess only some, but not all of these properties. For example silicon oxide, made in accordance with some preparations, has a low dielectric constant of about 4.5, but its relatively low density of 2.1 g/cm$^3$ suggests that pure silicon oxide would have low etch selectivity and will be a relatively poor etch stop material. On the other hand, aluminum oxide, made in accordance with some preparations, has a high density of about 3.0 g/cm$^3$, but its dielectric constant is typically greater than 7, resulting in increased capacitance of device structures containing aluminum oxide films. Aluminum nitride has a dielectric constant of about 6 but due to its relatively narrow band gap, it has a relatively high leakage current.

Composite films provided herein simultaneously have low dielectric constant and high density. In some embodiments, composite dielectric films having density of at least about 2.5 g/cm$^3$ and dielectric constant of less than about 7 are provided. For example composite films having density of at least about 2.5 g/cm$^3$ and dielectric constant of less than about 6 are provided. Further, in some embodiments provided films are characterized by a breakdown voltage of greater than about 5 MV/cm, such as at least about 8 MV/cm. Examples of such films are composite films that contain (or consist essentially of) Al, Si, and O, and films that contain (or consist essentially of) Al, Si, O, and C as provided herein.

In some embodiments, the composite films are configured to contain all of the chemical elements of a first material that has a dielectric constant of less than about 7 (e.g., Si and O), and all of the chemical elements of a second material that has a density of at least about 2.5 g/cm$^3$ (e.g., Al and O). Preferably, the composite films are configured to contain all of the elements of a first material that has a dielectric constant of less than about 6, and all of the elements of a second material that has a density of at least about 2.6 g/cm$^3$. Preferably, both the first material and the second material have good adhesion to both metals and dielectrics, and are characterized by a low leakage current.

In some embodiments a semiconductor device is provided, where the semiconductor device includes two layers of ILD (e.g., a ULK dielectric) and a thin layer of provided dielectric composite film (e.g., between about 10-100 Å, such as about 20-30 Å), residing between the two ILD layers. The ILD layers may also include embedded metal (e.g., copper, tungsten, or cobalt) lines, and, in some embodiments, the thin layer of dielectric composite film also resides between metal and ILD (e.g., ULK dielectric), while contacting both the ILD and the metal.

Provided dielectric composite films are particularly well suited to be used as etch stop layers, but may also be used as interfacial layers for a variety of purposes (e.g., to improve electromigration resistance or as a hardmask).

Generally, provided films can be deposited on a planar or on a patterned substrate. In one embodiment, provided films are deposited on a semiconductor substrate having an exposed planar surface that includes both exposed dielectric and metal (e.g., copper, cobalt or tungsten).

Figure 1B:
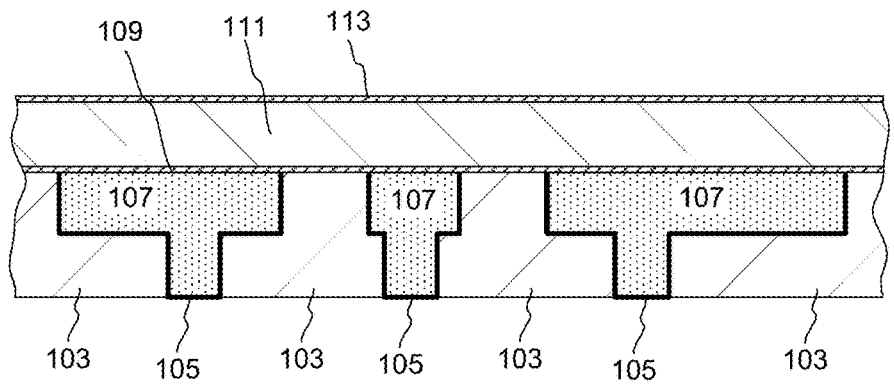
Figure 1C:
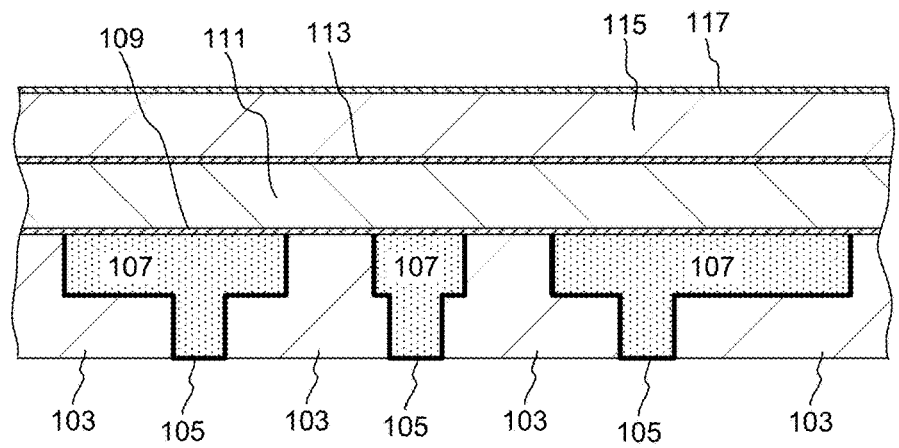

FIGS. 1A-1C provide an example of a semiconductor substrate undergoing several steps of dual Damascene processing, where provided dielectric composite films can be used. Referring to FIG. 1A, an example of a partially fabricated integrate circuit (IC) structure, 100, used for dual Damascene fabrication is illustrated. Structure 100, as shown in FIGS. 1A-1C, is part of a semiconductor substrate, and, in some embodiments, may directly reside on a layer containing active devices, such as transistors. In other embodiments, it may directly reside on a metallization layer or on other layers that incorporate conductive materials, e.g., layers containing memory capacitors.

A layer 103 illustrated in FIG. 1A is a layer of inter-layer dielectric, which may be silicon dioxide but is more typically a low-k dielectric material. In order to minimize the dielectric constant of the inter-metal dielectric stack, materials with a k value of less than about 3.5, preferably less than about 3.0 and often lower than about 2.8 are employed as inter layer dielectrics. These materials include but are not limited to fluorine or carbon doped silicon dioxide, organic low-k materials and porous doped silicon dioxide materials. Such materials can be deposited, for example, by PECVD or by spin-on methods. In some embodiments layer 103 contains ULK dielectric. Layer 103 is etched with line paths (trenches and vias) in which a partially conductive metal diffusion barrier 105 is deposited, followed by inlaying with copper conductive routes 107. In other embodiments, metals other than copper (e.g., cobalt or tungsten) are used. Because copper or other mobile conductive material provides the conductive paths of the semiconductor substrate, the underlying silicon devices and dielectric layers proximate to metal lines must be protected from metal ions (e.g., $Cu^{2+}$) that might otherwise diffuse or drift into the silicon or inter-layer dielectric and result in degradation of their properties. Several types of metal diffusion barriers are used in order to protect the dielectric layers of the IC device. These types may be divided into partially conductive metal-containing layers such as 105 and dielectric barrier layers. Suitable materials for partially conductive diffusion barrier 105 include materials, such as tantalum, tantalum nitride, titanium, titanium nitride and the like. These are typically conformally deposited onto a dielectric layer having vias and trenches by a PVD or an ALD method.

Copper conductive routes 107 can be formed, after diffusion barrier layer 105 has been deposited, by a number of techniques, including PVD, electroplating, electroless deposition, CVD, etc. In some implementations, a preferred method of forming a copper fill includes depositing a thin seed layer of copper by PVD and subsequently depositing bulk copper fill by electroplating. Since copper is typically deposited with overburden residing in the field region, a chemical mechanical polishing (CMP) operation is needed to remove the overburden and to obtain a planarized structure 100. As it was mentioned, in some embodiments, conductive routes 107 are made of tungsten or cobalt, which can be deposited, for example, by CVD or ALD (where CVD and ALD can be thermal or plasma-assisted).

Next, referring to FIG. 1B, after the structure 100 has been completed, the dielectric composite etch stop film 109 (e.g., an AlSiOC film) is deposited onto copper lines 107 and onto dielectric 103, using methods provided herein. The dielectric composite film can be deposited by CVD, PECVD, ALD, iALD, conformal film deposition (CVD), or any combination of these methods. It is noted that in some embodiments the top portion of the ILD layer 103, onto which the layer 109 is deposited, may be different from the bulk of that layer. For example, in some embodiments, the top portion of layer 103 is more mechanically robust than the bulk. In one implementation the top portion of layer 103 is a mechanically robust doped or undoped silicon-carbide or silicon nitride, while the bulk of the dielectric layer 103 is a more delicate ULK dielectric (e.g., a porous material). In one example the top portion of layer 103 is oxygen-doped silicon carbide (ODC). Presence of such more robust layer makes it easier to deposit etch stop films using plasma steps, without damaging the exposed portions of the substrate.

In some embodiments, the dielectric composite etch stop layer 109 further serves as a dielectric diffusion barrier layer, as it resides at an interface between copper and dielectric in the fabricated structure. In some embodiments, a separate diffusion barrier layer is deposited on top of the layer 109. Typically, such diffusion barrier layer (not shown) includes doped or undoped silicon carbide (e.g., silicon oxycarbide) or silicon nitride.

Referring to FIG. 1B, a first dielectric layer, 111, of a dual Damascene dielectric structure is deposited onto the film 109. This is followed by deposition of an etch stop film 113 on the first dielectric layer 111. The etch stop film 113 may be one of the dielectric composite films provided herein, or it may contain a different etch stop material. The dielectric layer 111 is typically composed of low-k dielectric materials such as those listed for a dielectric layer 103, and may also include a more mechanically robust top portion (e.g., a top portion composed of ODC). Note that layers 111 and 103 need not necessarily have identical composition. In some embodiments both layer 111 and 103 are ULK dielectric layers.

The process follows, as depicted in FIG. 1C, where a second dielectric layer 115 of the dual Damascene dielectric structure is deposited in a similar manner to the first dielectric layer 111, onto an etch-stop film 113. Deposition of an antireflective layer (not shown) and a CMP stop film 117 follows. Second dielectric layer 115 typically contains a low-k dielectric material such as those described above for layers 103 and 111, and may optionally include a more mechanically robust top portion. A CMP stop film 117 serves to protect the delicate dielectric material of inter-layer dielectric (IMD) layer 115 during subsequent CMP operations. Typically, a CMP stop layer is subject to similar integration requirements as a diffusion barrier and etch stop films 109 and 113, and can include dielectric composite materials provided herein. Alternatively, it may contain a conventional CMP stop material based on silicon carbide or silicon nitride.

During subsequent operations, ILD layers 111 and 115 are patterned to form recessed features (vias and trenches). Patterning is usually performed using conventional photolithographic techniques, and involves applying photoresist to the substrate, exposing the photoresist to light, patterning the photoresist and transferring the pattern to the substrate by etching the dielectric material typically using a fluorine-based chemistry, and removing the photoresist. Provided composite dielectric etch stop layers have good etch selectivity versus the ILD dielectric (e.g., ULK dielectric and/or ODC), and protect the materials that reside below the etch stop layers from being etched.

It is noted that the provided dielectric etch stop films can be used in a variety of different integration schemes, and their use is not limited to the scheme illustrated in FIGS. 1A-1C.

Figure 2:
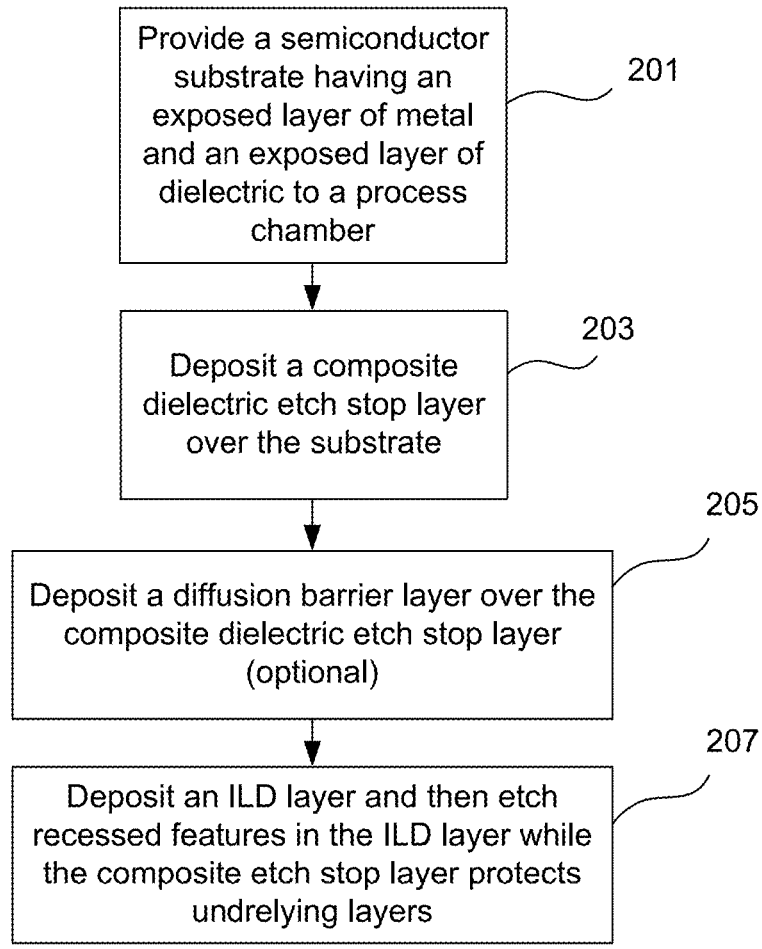
FIG. 2 is a process flow diagram for a processing method provided herein.

The process flow diagram for a processing method that utilizes a dielectric composite film as an etch stop layer is provided in FIG. 2. The process starts in 201 by providing a semiconductor substrate having an exposed layer of metal and an exposed layer of dielectric. For example, the substrate may include an exposed layer of ULK dielectric and an exposed metal layer, such as a copper, tungsten, or cobalt layer. An example of such substrate is illustrated in FIG. 1A. Next, in 203, a composite dielectric film is deposited over the substrate. The deposition can be carried out using a variety of methods including thermal CVD, plasma enhanced CVD (PECVD), thermal ALD, and ion induced ALD (iALD), conformal film deposition (CFD) and any combination thereof.

In one embodiment deposition of the composite dielectric layer includes providing one or more precursors containing the elements of the composite film to a process chamber and configuring the process conditions for deposition of the composite dielectric composite film on the substrate. Suitable volatile aluminum-containing precursors include but are not limited to organoaluminum compounds, such as trimethylaluminum (TMA), dimethylaluminum hydride, triethylaluminum, triisobutylaluminum, and tris(diethylamino) aluminum. In many embodiments TMA is the preferred compound. Examples of silicon-containing precursors include without limitation silane ($SiH_4$), disilane, alkylsilanes, and alkylaminosilanes, such as diisopropylaminosilane (DIPAS). Silicon-containing precursors containing methyl groups (such as DIPAS) are preferred in some embodiments. Germanium can be introduced into the film, for example, by using germane as a precursor. Oxygen can be introduced with oxygen-containing reactants, such as $CO_2$, $N_2O$, $O_2$, etc. Nitrogen can be introduced by using nitrogen-containing reactants, such as $N_2O$ and $NH_3$. Carbon can be introduced by using carbon-containing reactants, such as $CO_2$ and hydrocarbons. It is noted that in some embodiments a single precursor or reactant can supply more than one element to the composite film. In other embodiments, each element is supplied by a different precursor and/or reactant.

In one example, where the composite film contains at least two elements selected from the group consisting of Al, Si, and Ge, and at least one element selected from the group consisting of O, C, and N, the deposition method involves providing precursors containing at least two of the elements selected from the group consisting of Al, Si, and Ge (e.g., trimethylaluminum and diisopropylaminosilane), and a reactant containing an element selected from the group consisting of O, C, and N (e.g., an oxygen-containing species). The reaction can proceed thermally or in a plasma. The introduction of precursors and reactants in some embodiments is sequential. In some embodiments the reaction occurs primarily on the surface of the substrate, and mixing of precursors and reactants in bulk in the process chamber is suppressed or not allowed. In other embodiments mixing of precursors and reactants in bulk in the process chamber is allowed, and the reaction may occur both on the surface of the substrate and in bulk in the volume of the process chamber.

In one embodiment a composite film comprising Al, Si, and O is deposited by providing a silicon-containing precursor and an aluminum-containing precursor to the process chamber housing the semiconductor substrate and by reacting the silicon-containing precursor and the aluminum-containing precursor with an oxygen-containing species to form the dielectric composite film on the substrate, wherein the film includes Al—O and Si—O bonds. In one implementation of this embodiment, the aluminum-containing precursor, the silicon-containing precursor and the oxygen-containing species are allowed to mix in the process chamber, and the film is deposited by CVD. In some implementations the reaction is assisted with a plasma. The amounts of elements incorporated into the composite film can be controlled by controlling the partial pressures of the silicon-containing precursor and the aluminum-containing precursor provided to the process chamber.

In another implementation, a plurality of alternating sublayers (a nanolaminate), forming the dielectric composite film is deposited. In this implementation, the substrate is first contacted with a first precursor (an aluminum-containing precursor or a silicon-containing precursor) which is then reacted with an oxygen-containing species (with or without plasma) to deposit a sublayer of a first type. Next, the substrate is contacted with a second precursor (an aluminum-containing precursor or a silicon-containing precursor) that is different from the first precursor which is then reacted with an oxygen-containing species (with or without plasma) to deposit a sublayer of a second type. For example the first precursor may be an aluminum-containing precursor which forms an AlO layer as the first sublayer upon reaction with an oxygen-containing species, and the second precursor may be a silicon-containing precursor which forms a SiO layer as the second sublayer upon reaction with an oxygen-containing species. Next, deposition of AlO and SiO sublayers is repeated as many times as necessary to build an etch stop film having a desired thickness. Preferably, the thickness of each sublayer is controlled not to exceed 10 Å, such as not to exceed 5 Å. The amounts of elements (e.g., Al and Si) incorporated into the film can be controlled by controlling the thicknesses of sublayers in the nanolaminate. For example, in some embodiments the thickness of an aluminum-containing sublayer is between about 0.5-3 times the thickness of a silicon-containing sublayer.

In yet another implementation the deposition of the composite film involves providing a first precursor (a silicon-containing precursor or an aluminum-containing precursor) to the process chamber housing the substrate and allowing the first precursor to adsorb on the surface of the substrate. This is followed by purging and/or evacuation of the process chamber to remove the unadsorbed precursor from the process chamber. Next a second precursor (a silicon-containing precursor or an aluminum-containing precursor) that is different from the first precursor is provided to the process chamber and is allowed to adsorb on the surface of the substrate. Next, after a purge and/or evacuation, the silicon-containing precursor and the aluminum-containing precursor residing on a substrate are allowed to react with an oxygen-containing species (e.g., in a plasma formed in an oxygen-containing gas, such as $CO_2$ or $N_2O$), to form a composite film having Al—O and Si—O bonds on the surface of the substrate. Next, the precursor dosings and conversion to oxides is repeated until a film of desired thickness is formed. The relative amounts of the elements incorporated into the composite films can be controlled by the amount of precursors provided during each precursor dosing step. In some embodiments the surface of the substrate is not saturated by the precursors, when the precursors are dosed. When adsorption is conducted at below saturation, control over incorporation of individual elements is easily achieved by adjusting the dosing conditions.

In some embodiments, the composite films are deposited by a combination of surface-based reaction (ALD) and deposition from the bulk of the process chamber (CVD). For example both surface-based reactions and deposition from bulk can occur, if the precursors are not completely removed from the process chamber after each adsorption step.

Referring again to the process flow diagram of FIG. 2, after the composite etch stop layer has been deposited, the process follows by optionally depositing a dielectric diffusion barrier layer over and in contact with the composite etch stop film, as shown in 205. The diffusion barrier film may be an oxygen-doped silicon carbide layer deposited, for example, by PECVD.

Next, in operation 207 an ILD layer is deposited over the etch stop layer and the optional diffusion barrier film. The ILD layer is then etched at selected locations (after standard photolithographic patterning) to form recessed features. During the etch, which is typically conducted using fluorine-based chemistry, the composite dielectric etch stop layer protects materials that underlie the etch stop layer from being etched.

Figure 3:
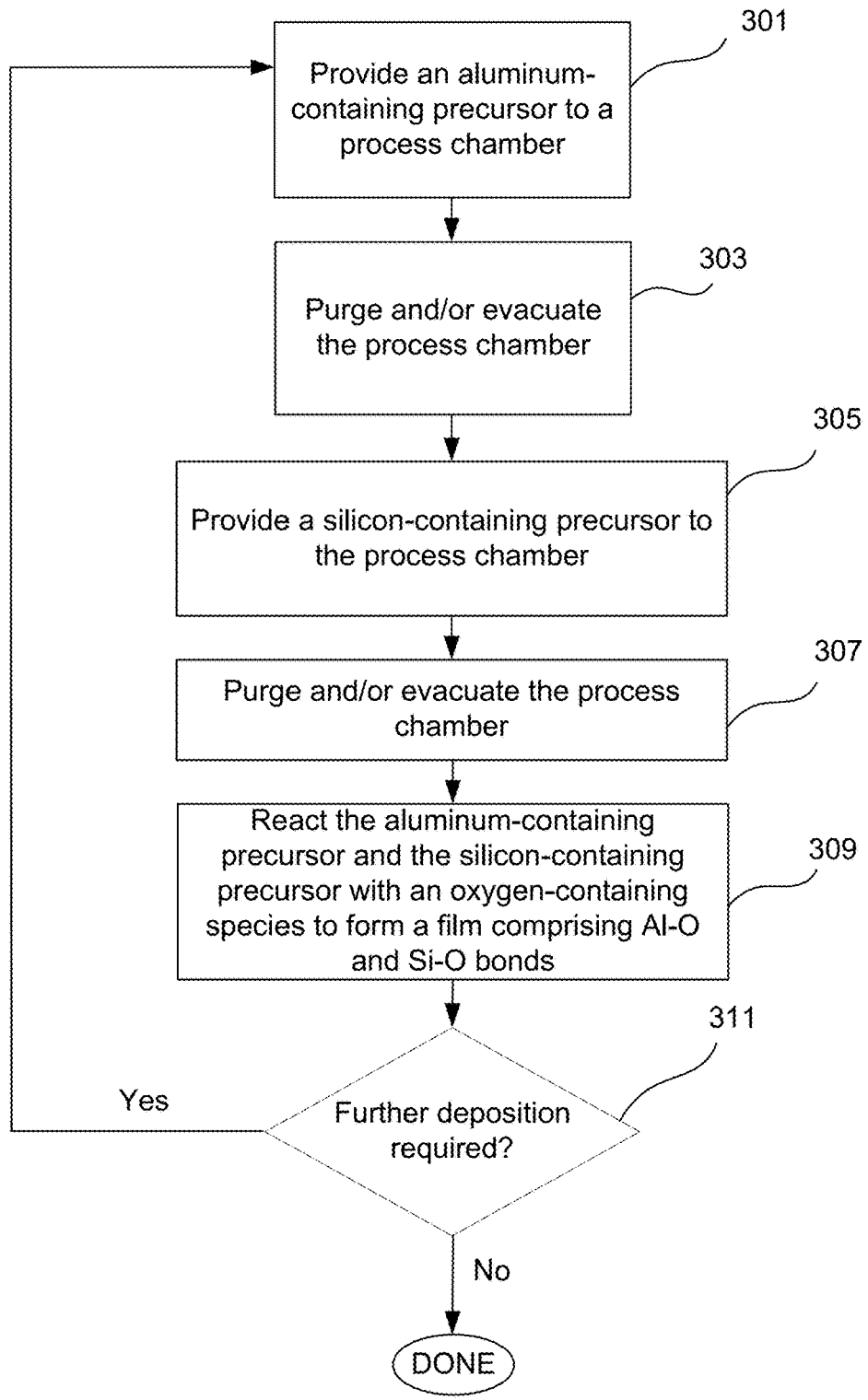
FIG. 3 is a process flow diagram for a method of depositing a dielectric composite film according to an embodiment provided herein.

One of the exemplary processes for deposition of a dielectric composite etch stop layer is illustrated in FIG. 3. The process involves placing the semiconductor substrate into a process chamber (e.g., into an iALD process chamber), and in operation 301 providing an aluminum-containing precursor (e.g., TMA) to the process chamber. In some embodiments the aluminum-containing precursor is provided to the process chamber with a carrier gas, such as $N_2$, or a noble gas. The temperature and pressure during this step are selected such as to allow adsorption of the aluminum-containing precursor on the surface of the substrate. Next, in operation 303 the process chamber is purged and/or evacuated to remove the unadsorbed aluminum-containing precursor from the process chamber. In some embodiments the removal is substantially complete. In other embodiments, a portion of aluminum-containing precursor can remain in the process chamber. The process follows in 305 by providing a silicon-containing precursor (e.g., diisopropylaminosilane) to the process chamber. The silicon-containing precursor can be provided with a carrier gas such as $N_2$ or a noble gas. When the silicon-containing precursor is a liquid, a vapor of the precursor is introduced. Importantly, in some embodiments the aluminum-containing precursor and the silicon-containing precursor are introduced to the process chamber via separate conduits, such that no mixing of these precursors would occur during the delivery to the process chamber. The silicon-containing precursor is then allowed to adsorb to the surface of the substrate. Next, in 307 the process chamber is purged and/or evacuated to remove the unadsorbed silicon-containing precursor. In some embodiments, the unadsorbed silicon-containing precursor is substantially completely removed from the process chamber. In other embodiments a portion of the silicon-containing precursor may remain in the process chamber after 307. Next, in operation 309 the aluminum-containing precursor and the silicon-containing precursor are reacted with an oxygen-containing species to form a film comprising Al—O bonds and Si—O bonds on the substrate. For example, an oxygen-containing process gas, such as $CO_2$, $N_2O$, $O_2$ or any mixture thereof, may be introduced into the process chamber, and plasma may be formed in the process gas. In other embodiments the oxidation process is conducted thermally in an absence of plasma. The reaction between the oxygen-containing species and the silicon-containing and aluminum-containing precursors occurs on the surface of the substrate. In those implementations, where the precursors are not completely removed from the bulk of the process chamber, the reaction may also occur off of the surface of the substrate, and the reaction product is deposited onto the substrate in a low-rate CVD deposition in addition to the surface reaction. In these embodiments, the process may be viewed as a combination of iALD and PECVD. In one of the preferred embodiments, the oxidative treatment is conducted using a plasma formed in a mixture of $CO_2$ and argon, as this chemistry is found to produce films with a particularly advantageous combination of density and dielectric constant. As a result, a film containing Al, Si, O, and C is formed on a substrate. Typically, one cycle of operations 301-309 forms a film having an average thickness of between about 0.8-3 Å on the substrate. In operation 311 a decision is made whether further deposition is required. If the layer is not sufficiently thick, operations 301-309 are repeated until a dielectric composite film of desired thickness is formed. Typically, the deposition process involves performing a cycle of operations 301-309 at least 3 times, such as at least 5 times, e.g., between about 5-20 times. It is noted that the process shown in FIG. 3 may start with providing an aluminum-containing precursor or the silicon-containing precursor as the first precursor contacting the substrate having an exposed layer of metal and dielectric.

Suitable process conditions for deposition of a composite dielectric AlSiOC film according to the method illustrated in FIG. 3 are provided in Table 1.

TABLE 1

Illustrative process conditions for deposition of a composite AlSiOC film

| Process Step | Process gas composition | Temperature, °C | Pressure, Torr | Plasma | Time, seconds |
|---|---|---|---|---|---|
| Al dosing | TMA, $N_2$ | 300-420 | 1-10 | No | 0.5 to 5 |
| Purge | $N_2$ | 300-420 | 1-10 | No | 2 to 5 |
| Si dosing | DIPAS, $N_2$ | 300-420 | 1-10 | No | 0.5 to 5 |
| Purge | $N_2$ | 300-420 | 1-10 | No | 2 to 5 |
| Conversion | $CO_2$, Ar, $N_2$ | 300-420 | 1-10 | Yes | 1 to 10 |

In some embodiments, the entire deposition of the composite film is performed in a single process chamber. The deposition illustrated in Table 1 can be performed in any suitable apparatus that has a plasma generator associated with the process chamber. Plasma used during the conversion step can be generated using a radio frequency (RF) generator. Radio Frequency (RF) plasma may be formed using either high frequency (HF) or dual frequency generation, where dual frequency includes both low frequency (LF) and HF generation. Example low-frequency RF frequencies may include, but are not limited to, frequencies between 50 kHz and 900 kHz. Example high-frequency RF frequencies may include, but are not limited to, frequencies between 1.8 MHz and 2.45 GHz. In one embodiment, the high frequency is 13.56 MHz, and the low frequency is 400 kHz. In various embodiments the LF power ranges from about 100 to 2000 W per process module containing four 300 mm wafers, and the HF power ranges from about 400 to about 3000 W for the same process module, corresponding to HF power density of between about 0.14-1.1 $W/cm^2$, and LF power density of between about 0.03-0.71 $W/cm^2$. In various embodiments the substrate is treated with plasma in the conversion step for about 0.2-60 seconds.

The flow rates of process gas components can differ depending on the size of the process chamber, and on the desired properties of the film that is being deposited, and typically are in a range of about 20-20,000 sccm.

The content ratio of aluminum to silicon in the film is controlled in some embodiments by controlling the dosing times for aluminum-containing precursor and silicon-containing precursor (e.g., the ratio of dosing times may be controlled). For example, in order to increase aluminum content, the substrate may be exposed to the aluminum containing precursor for a longer time. Similarly, in order to increase silicon content, the substrate may be exposed to a silicon-containing precursor for a longer time.

In some embodiments the ratio of aluminum to silicon content in the film is controlled by controlling the ratio of times that different types of cycles are performed, where a first type of cycle deposits an aluminum-containing sublayer and a second type of cycle deposits a silicon-containing sublayer. For example, the first type of cycle can include exposing the substrate to an aluminum-containing precursor, purging and/or evacuating the process chamber to remove the unadsorbed aluminum-containing precursor; and then oxidizing the adsorbed aluminum-containing precursor on the substrate (e.g., by an oxygen-containing plasma) to form a sublayer containing Al—O bonds. The second type of cycle can include exposing the substrate to a silicon-containing precursor, purging and/or evacuating the process chamber to remove the unadsorbed silicon-containing precursor; and then oxidizing the adsorbed silicon-containing precursor on the substrate (e.g., by an oxygen-containing plasma) to form a sublayer containing Si—O bonds. In some embodiments repeating cycles of the first type three times and performing the second type of cycle one time will provide a 3:1 Al:Si ratio if dosing times for each of the precursors are adjusted to provide substantially equal growth rates for the film sublayers.

Table 2 lists experimental data for AlSiOC film that was deposited using methods provided herein and for comparative AlOC and SiO films.

TABLE 2

Comparison of composite films to AlOC and SiO films.

| Parameter | AlOC Film I (comparative example) | SiO (comparative example) | AlOC Film II (comparative example) | AlSiOC |
|---|---|---|---|---|
| Film thickness, Å | 255 | 275 | 295 | 138 |
| Leakage Current (@2 MV/cm), Amp/cm$^2$ | $3.92 \cdot 10^{-9}$ | $6.68 \cdot 10^{-9}$ | $6.23 \cdot 10^{-9}$ | $1.24 \cdot 10^{-8}$ |
| Breakdown Voltage, MV/cm | 10.15 | none | 12.04 | 12.69 |
| k | 7.56 | 4.54 | 5.53 | 4.99 |
| Density, g/cm$^3$ | 3.088 | 2.141 | 2.534 | 2.723 |

AlSiOC film was deposited using general process conditions provided in Table 1. The comparative AlOC films were deposited as shown in Table 1 with an omission of Si dosing step. The comparative SiO film was deposited as provided in Table 1 with omission of Al dosing step. The films were deposited to thicknesses that are greater than those that are used in etch stop films in order to accurately measure the dielectric constant, density, leakage current, and breakdown voltage. It can be seen that the composite AlSiOC film possesses dielectric constant of less than 6, and density of greater than 2.6 g/cm$^3$, while simultaneously having low leakage current and high breakdown voltage. Neither one of the comparative AlOC and SiO films simultaneously possesses the desired combination of low dielectric constant and high density. The comparative AlOC film II has a relatively low dielectric constant, but its density is significantly lower than the density of AlSiOC film. The finding that the density of the composite AlSiOC material is at least 2.5 g/cm$^3$, was unexpected, because it was expected that the density of the composite film would be substantially lower due to relatively loose packing of atoms of different sizes within the film.

Apparatus

Another aspect of the implementations disclosed herein is an apparatus configured to accomplish the methods described herein. A suitable apparatus includes hardware for accomplishing the process operations and a system controller having instructions for controlling process operations in accordance with the disclosed implementations. Hardware for accomplishing the process operations includes ALD (including iALD) processing chambers and CVD (including PECVD) processing chambers. In some embodiments all operations of provided methods are performed in a single process chamber. In other implementations the substrate may be transferred from chamber to chamber to perform different steps of the method. The system controller will typically include one or more memory devices and one or more processors configured to execute the instructions so that the apparatus will perform a method in accordance with the disclosed implementations. Machine-readable media containing instructions for controlling process operations in accordance with the disclosed implementations may be coupled to the system controller.

In some embodiments the deposition is conducted in an iALD reactor which is a part of a Vector Excel deposition module available from Lam Research Corp. of Fremont, Calif. A suitable process chamber includes a support for holding the wafer substrate during deposition (wafer pedestal), a generator for forming plasma in the process chamber, and conduits for delivering the aluminum-containing precursor, the silicon-containing precursor and oxygen-containing process gases (e.g., $CO_2$, argon, helium, etc.) to the process chamber. In some embodiments the conduits are separate conduits, where each conduit is connected with a source of an aluminum-containing precursor, a source of a silicon-containing precursor, and a source of an oxygen-containing gas respectively. In some embodiments, the conduits are connected such that the aluminum-containing precursor and the silicon-containing precursor are not allowed to mix within the conduits (e.g., within the delivery lines). The apparatus is further configured for purging and/or evacuating the process chamber, and for maintaining a desired pressure and temperature in the process chamber during deposition.

Examples of iALD process chambers are described in U.S. Pat. Nos. 6,416,822, 6,428,859, and 8,747,964 which are herein incorporated by reference in their entireties.

Figure 4:
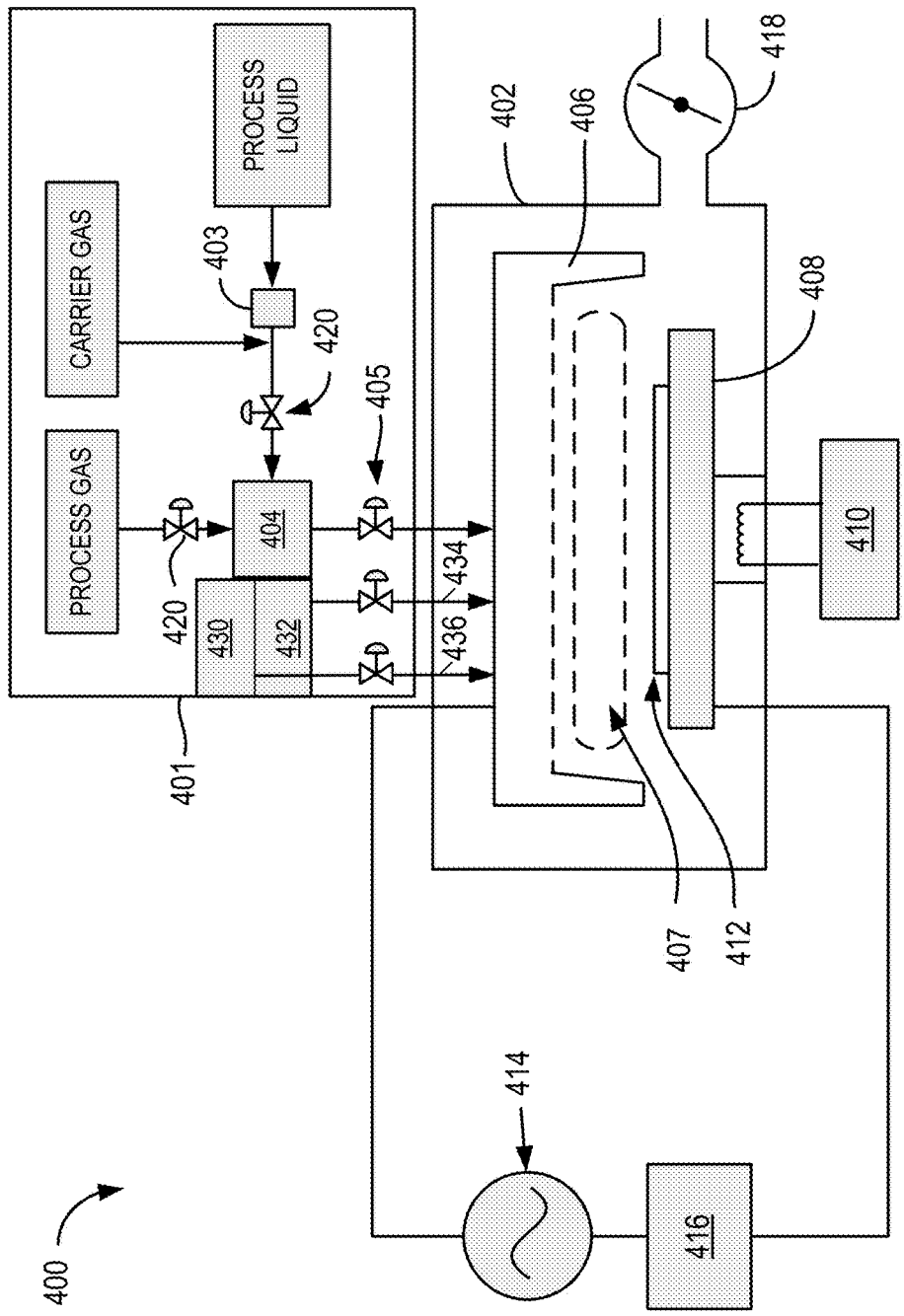
FIG. 4 is a schematic presentation of an iALD process station that can be used for deposition of composite films according to an embodiment provided herein.

FIG. 4 schematically shows an embodiment of a process station 400 that may be used to deposit provided films using atomic layer deposition iALD. For simplicity, the process station 400 is depicted as a standalone process station having a process chamber body 402 for maintaining a low-pressure environment. However, it will be appreciated that a plurality of process stations 400 may be included in a common process tool environment. Further, it will be appreciated that, in some embodiments, one or more hardware parameters of process station 400, including those discussed in detail below, may be adjusted programmatically by one or more computer controllers.

Process station 400 fluidly communicates with reactant delivery system 401 for delivering process gases to a distribution showerhead 406. Reactant delivery system 401 includes a mixing vessel 404 for blending and/or conditioning process gases for delivery to showerhead 406. One or more mixing vessel inlet valves 420 may control introduction of process gases to mixing vessel 404. Similarly, a showerhead inlet valve 405 may control introduction of process gasses to the showerhead 406.

Some reactants, may be stored in liquid form prior to vaporization at and subsequent delivery to the process station. For example, the embodiment of FIG. 4 includes a vaporization point 403 for vaporizing liquid reactant to be supplied to mixing vessel 904. In some embodiments, vaporization point 403 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller upstream of vaporization point 403 may be provided for controlling a mass flow of liquid for vaporization and delivery to process station 400. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

In some embodiments, in order to avoid mixing of aluminum-containing precursor with the silicon-containing precursor, separate conduits 436 and 434 are used to fluidically connect the source of an aluminum-containing precursor 430 and the source of silicon-containing precursor 432 respectively to the showerhead, such as to ensure separate delivery of these precursors to the process chamber.

Showerhead 406 distributes process gases toward substrate 412. In the embodiment shown in FIG. 4, substrate 412 is located beneath showerhead 406, and is shown resting on a pedestal 408. It will be appreciated that showerhead 406 may have any suitable shape, and may have any suitable number and arrangement of ports for distributing processes gases to substrate 412.

In some embodiments, a microvolume 407 is located beneath showerhead 406. Performing an ALD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 408 may be raised or lowered to expose substrate 412 to microvolume 407 and/or to vary a volume of microvolume 407. For example, in a substrate transfer phase, pedestal 408 may be lowered to allow substrate 412 to be loaded onto pedestal 408. During a deposition process phase, pedestal 408 may be raised to position substrate 412 within microvolume 407. In some embodiments, microvolume 407 may completely enclose substrate 412 as well as a portion of pedestal 408 to create a region of high flow impedance during a deposition process.

Optionally, pedestal 408 may be lowered and/or raised during portions the deposition process to modulate process pressure, reactant concentration, etc., within microvolume 407. In one scenario where process chamber body 402 remains at a base pressure during the deposition process, lowering pedestal 408 may allow microvolume 407 to be evacuated. Example ratios of microvolume to process chamber volume include, but are not limited to, volume ratios between 1:900 and 1:10. It will be appreciated that, in some embodiments, pedestal height may be adjusted programmatically by a suitable computer controller.

In another scenario, adjusting a height of pedestal 408 may allow a plasma density to be varied during plasma activation and/or treatment cycles included in the deposition process. At the conclusion of the deposition process phase, pedestal 408 may be lowered during another substrate transfer phase to allow removal of substrate 412 from pedestal 408.

While the example microvolume variations described herein refer to a height-adjustable pedestal, it will be appreciated that, in some embodiments, a position of showerhead 406 may be adjusted relative to pedestal 408 to vary a volume of microvolume 407. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers.

Returning to the embodiment shown in FIG. 4, showerhead 406 and pedestal 408 electrically communicate with RF power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 50 kHz and 900 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 408 may be temperature controlled via heater 410. Further, in some embodiments, pressure control for deposition process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to process station 400.

Figure 5:
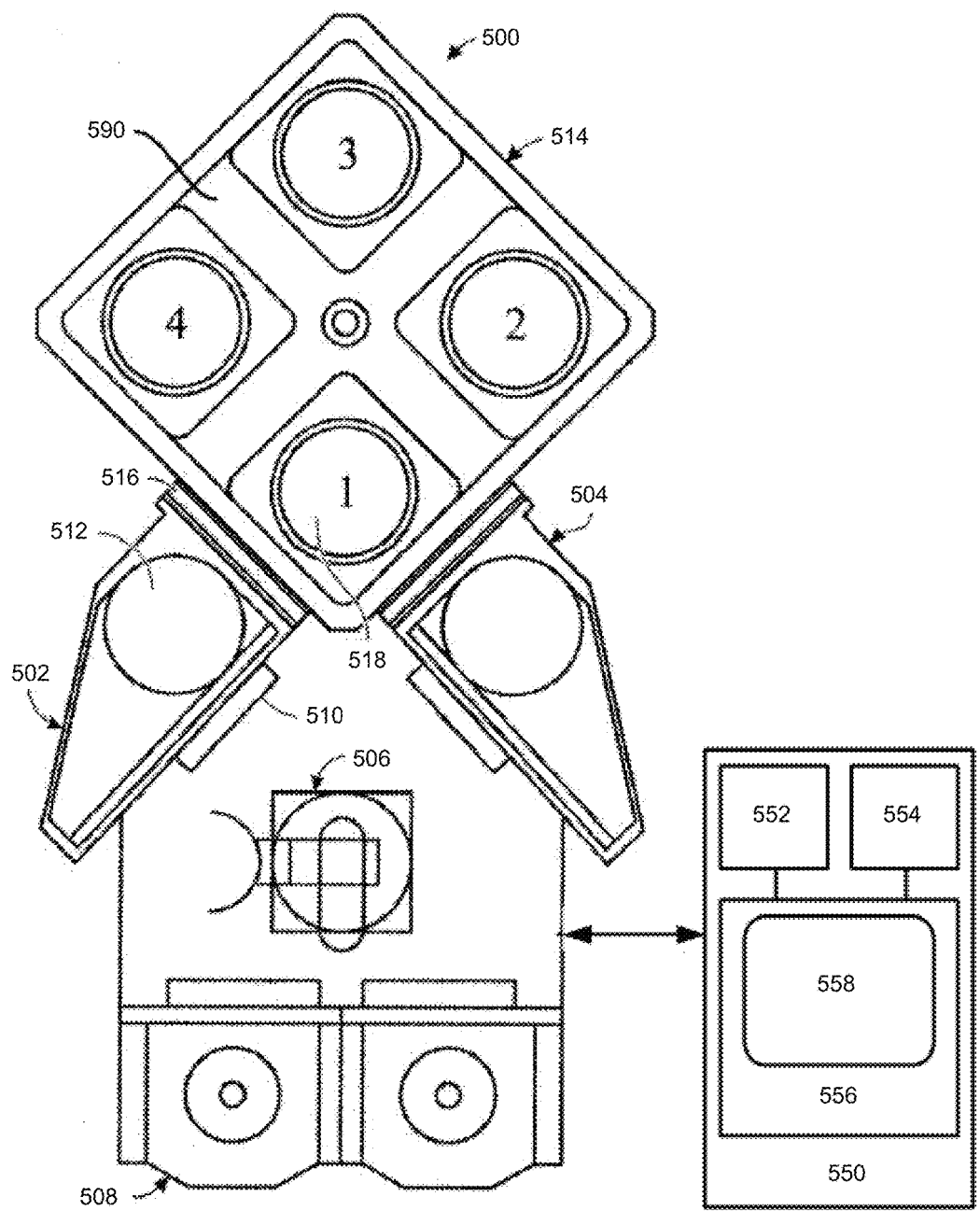
FIG. 5 shows a schematic view of a multi-station processing tool according to an embodiment provided herein.

In some embodiments, the substrates provided herein are processed in a multi-station tool. FIG. 5 shows a schematic view of an embodiment of a multi-station processing tool 500 with an inbound load lock 502 and an outbound load lock 504, either or both of which may comprise a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 comprises a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing.

The depicted processing chamber 514 comprises four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. While the depicted processing chamber 514 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 also depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. System control software 558 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 500. System control software 558 may be configured in any suitable way. For example, various process tool component subroutines or control objects may be written to control operation of the process tool components necessary to carry out various process tool processes in accordance with the disclosed methods. System control software 558 may be coded in any suitable computer readable programming language.

In some embodiments, system control software 558 may include input/output control (IOC) sequencing instructions for controlling the various parameters described above. For example, each phase of an iALD process may include one or more instructions for execution by system controller 550. The instructions for setting process conditions for an iALD process phase may be included in a corresponding iALD recipe phase. In some embodiments, the iALD recipe phases may be sequentially arranged, so that all instructions for an iALD process phase are executed concurrently with that process phase.

Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

Figure 6:
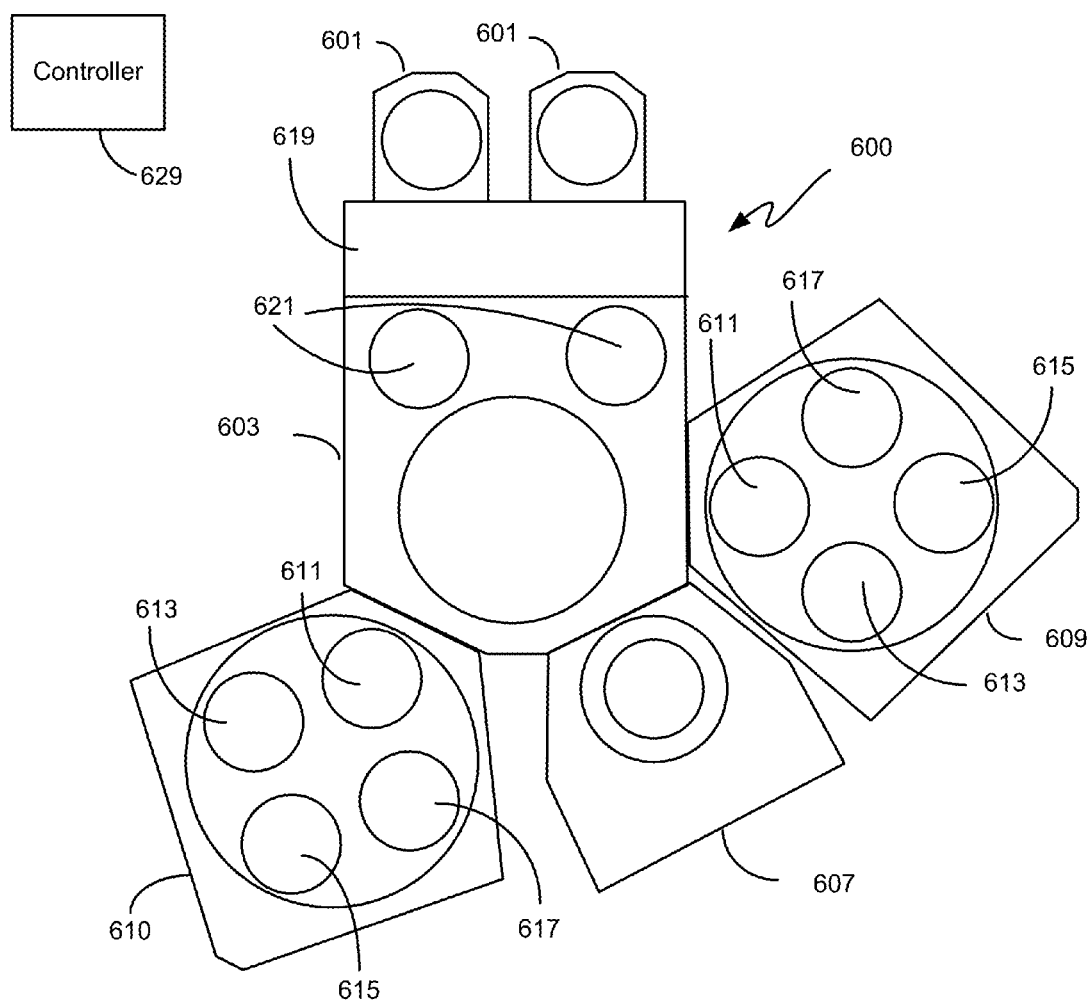
FIG. 6 is a block diagram of a processing tool configured for depositing thin films according to an embodiment provided herein.

FIG. 6 is a block diagram of a processing system suitable for conducting thin film deposition processes in accordance with certain embodiments. The system 600 includes a transfer module 603. The transfer module 603 provides a clean, pressurized environment to minimize risk of contamination of substrates being processed as they are moved between various reactor modules. Mounted on the transfer module 603 are two multi-station reactors 609 and 610, each capable of performing atomic layer deposition (ALD) and/or chemical vapor deposition (CVD) according to certain embodiments. Reactors 609 and 610 may include multiple stations 611, 613, 615, and 617 that may sequentially or non-sequentially perform operations in accordance with disclosed embodiments. The stations may include a heated pedestal or substrate support, one or more gas inlets or showerhead or dispersion plate.

Also mounted on the transfer module 603 may be one or more single or multi-station modules 607 capable of performing plasma or chemical (non-plasma) pre-cleans, or any other processes described in relation to the disclosed methods. The module 607 may in some cases be used for various treatments to, for example, prepare a substrate for a deposition process. The module 607 may also be designed/configured to perform various other processes such as etching or polishing. The system 600 also includes one or more wafer source modules 601, where wafers are stored before and after processing. An atmospheric robot (not shown) in the atmospheric transfer chamber 619 may first remove wafers from the source modules 601 to loadlocks 621. A wafer transfer device (generally a robot arm unit) in the transfer module 603 moves the wafers from loadlocks 621 to and among the modules mounted on the transfer module 603.

In various embodiments, a system controller 629 is employed to control process conditions during deposition. The controller 629 will typically include one or more memory devices and one or more processors. A processor may include a CPU or computer, analog and/or digital input/output connections, stepper motor controller boards, etc.

The controller 629 may control all of the activities of the deposition apparatus. The system controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 629. The signals for controlling the process are output on the analog and digital output connections of the deposition apparatus 600.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper. Such processing may be employed, for example, to pattern the dielectric layers on which the tantalum nitride, tantalum, and/or copper layers are deposited, as described above.

What is claimed is:

1. A method for processing a semiconductor substrate, the method comprising:
    (a) providing a semiconductor substrate comprising an exposed dielectric layer; and
    (b) forming a dielectric composite film over the dielectric layer, wherein the dielectric composite film comprises Al, Si, and O and has a dielectric constant of less than about 7, and a density of at least about 2.5 g/cm$^3$, wherein forming the dielectric composite film comprises:
        (i) providing an aluminum-containing precursor to a process chamber housing the semiconductor substrate and adsorbing the aluminum-containing precursor on a surface of the semiconductor substrate;
        (ii) after the aluminum-containing precursor has adsorbed in (i), purging and/or evacuating the process chamber;
        (iii) after purging and/or evaciation of the process chamber in (ii), providing a silicon-containing precursor to the process chamber and adsorbing the silicon-containing precursor on the surface of the semiconductor substrate;
        (iv) after the silicon-containing precursor has adsorbed in (iii), purging and/or evacuating the process chamber; and
        (v) after purging and/or evacuation of the process chamber in (iv), reacting the adsorbed aluminum-containing precursor and the silicon-containing precursor with an oxygen-containing species to form the dielectric composite film on the semiconductor substrate, wherein the dielectric composite film comprises Al—O and Si—O bonds.

2. The method of claim 1, wherein the dielectric composite film is an etch stop film.

3. The method of claim 1, wherein the aluminum-containing precursor is trimethylaluminum.

4. The method of claim 1, wherein the silicon-containing precursor is diisopropylaminosilane.

5. The method of claim 1, wherein (v) comprises forming an oxygen-containing plasma.

6. The method of claim 1, wherein (v) comprises forming an oxygen-containing plasma in a process gas comprising $CO_2$.

7. The method of claim 1, further comprising repeating (i)-(v) at least 3 times.

8. The method of claim 1, wherein the dielectric composite film has a thickness of between about 10-50 Å.

9. The method of claim 1, wherein the dielectric composite film has a thickness of between about 20-30 Å.

10. The method of claim 1, wherein the exposed layer of dielectric is a layer of ultra low-k (ULK) dielectric and wherein the semiconductor substrate provided in (a) further comprises an exposed layer of metal, wherein the metal is selected from the group consisting of copper, tungsten, and cobalt, and wherein the composite dielectric film is formed over and in contact with both the ULK dielectric and the layer of metal.

11. The method of claim 1, further comprising:
    applying photoresist to the semiconductor substrate;
    exposing the photoresist to light;
    patterning the photoresist and transferring the pattern to the semiconductor substrate; and
    selectively removing the photoresist from the semiconductor substrate.

* * * * *